US005897945A

United States Patent [19]
Lieber et al.

[11] Patent Number: 5,897,945
[45] Date of Patent: Apr. 27, 1999

[54] METAL OXIDE NANORODS

[75] Inventors: Charles M. Lieber, Lexington; Peidong Yang, Somerville, both of Mass.

[73] Assignee: President and Fellows of Harvard College, Cambridge, Mass.

[21] Appl. No.: 08/606,892

[22] Filed: Feb. 26, 1996

[51] Int. Cl.[6] .............................. B32B 3/00; C04B 35/01; C30B 25/00
[52] U.S. Cl. ......................... 428/323; 428/328; 428/329; 428/330; 428/148; 428/149; 428/700; 428/701; 428/702; 428/903; 428/930; 505/230; 505/238; 117/87; 423/592
[58] Field of Search .................................... 428/401, 364, 428/375, 323, 328, 329, 330, 332, 293.1, 293.4, 148, 149, 699, 700, 701, 702, 903, 930; 505/230, 238; 117/87; 423/592, 593, 594, 598, 608, 622, 632, 635

[56] References Cited

U.S. PATENT DOCUMENTS

| | | | |
|---|---|---|---|
| 3,711,599 | 1/1973 | Brubaker | 423/638 |
| 3,951,677 | 4/1976 | Jacobson et al. | . |
| 4,414,196 | 11/1983 | Matsumoto et al. | 423/633 |
| 4,505,887 | 3/1985 | Miyata et al. | 423/635 |
| 4,581,289 | 4/1986 | Dietrich et al. | 428/379 |
| 4,778,716 | 10/1988 | Thorfinnson et al. | 428/236 |
| 4,806,198 | 2/1989 | Jagota et al. | 156/623 R |
| 4,925,641 | 5/1990 | Kitamura et al. | 423/279 |
| 5,202,306 | 4/1993 | Goretta et al. | 505/125 |
| 5,240,903 | 8/1993 | Shimoyama et al. | 505/125 |
| 5,284,822 | 2/1994 | Sakai et al. | 505/120 |
| 5,286,687 | 2/1994 | Murase et al. | 501/128 |
| 5,336,558 | 8/1994 | Debe | 428/323 |
| 5,418,007 | 5/1995 | Debe | 427/154 |
| 5,430,008 | 7/1995 | Morris | 505/150 |
| 5,441,726 | 8/1995 | Mitchnik et al. | 424/59 |
| 5,540,981 | 7/1996 | Gallagher et al. | 428/220 |
| 5,569,445 | 10/1996 | Fukatsu et al. | 423/633 |

OTHER PUBLICATIONS

Yang and Lieber, Science, 273:1836–1840, Sep. 27, 1996.
Adamopoulos et al., "An experimental study of flux pinning and flux dynamics . . . " Physica C 242 pp. 68–80, 1995.
Budhani et al., "Giant Suppression of Flux–Flow Resistivity . . . " Physical Review Letters, vol. 69, No. 26, pp. 3816–3819, Dec. 28, 1992.
Civale et al., "Vortex confinement by Columnar Defects . . . " Physical Review Letters vol. 67, No. 5, pp. 648–651, Jul. 29, 1991.
Fossheim et al., "Enhanced flux pinning . . . " Physica C 248, pp. 195–202, 1995.

Hayashi et al., "Growth of . . . " Journal of Materials Science 22, pp. 1305–1309, 1987.
Hwa et al., "Flux Pinning and Forced Vortex Entanglement by Splayed Columnar Defects" Physical Review Letters, vol. 71, No. 21, pp. 3545–3548, Nov. 22, 1993.
Krusin–Elbaum et al., "Enhancement of persistent currents . . . " Appl. Phys. Lett. 64 (24), pp. 3331–3333, Jun. 13, 1994.
Kummeth et al., "Enhancement of Critical Current Density . . . " Journal of Alloys and Compounds, 195, pp. 403–406, 1993.
Le Doussal et al., "Towards engineering of splayed columner defects in type II superconductors." Physica C 232 pp. 69–74, 1994.
Lieber et al., "Growth and Structure of Carbide Nanorods." Presented at the Materials Research Society, Boston, Nov. 27, 1995.
Miu et al., "Bose–glass behavior of the vortex system in epitaxia . . . " Physical Review B vol. 51, No. 6, pp. 3953–3956, Feb. 01, 1995.
Nelson et al., "Boson Localization and Pinning by Correlated Disorder . . . " Physical Review Letters, vol. 68, No. 15, pp. 2398–2401, Apr. 13, 1992.
Nomura et al., "Fabrication conditions and superconducting properties of Ag–sheathed . . . " Appl. Phys. Lett. 62 (17), pp. 2131–2133, Apr. 26, 1993.
Sharma et al., "Growth of Zn0 Whiskers, Platelets, and Dendrites." Journal of Applied Physics, vol. 42, pp. 5302–5304, Dec, 1971.
Wolff et al., "Growth and Morphology of Magnesium Oxide Whiskers." Journal of the American Ceramic Society, vol. 48, No. 6, pp. 279–285, Jun. 21, 1965.
Wong et al., "Processing–Microstructure . . . " J. Am. Ceram. Soc., 77 (11), pp. 2833–40, 1994.
Yuan et al., "Whisker/matrix interface and microstructure . . . " J. Mater. Res., vol. 11, No. 1, pp. 18–27, Jan., 1996.
Yuan et al., "Superconducting properties of MgO–whisker reinforced BPSCCO composite." Physica C 250 pp. 247–255, 1995.
Yuan et al., "Solid–state processing and phase development of bulk . . . " J. Mater. Res., vol. 11, No. 1, pp. 8–17, Jan., 1996.
Zhu et al., "In situ growth of epitaxial . . . " Appl. Phys. Lett. 63 (3), pp. 409–411, Jul. 19, 1993.

*Primary Examiner*—Marie Yamnitzky
*Attorney, Agent, or Firm*—Fish & Richardson P.C.

[57] ABSTRACT

Metal oxide nanorods and composite materials containing such nanorods. The metal oxide nanorods have diameters between 1 and 200 nm and aspect ratios between 5 and 2000.

26 Claims, No Drawings

METAL OXIDE NANORODS

STATEMENT AS TO FEDERALLY SPONSORED RESEARCH

This invention was made with support from the National Science Foundation (MRSEC, Grant No. DMR-94-00396) and the Department of Navy (Grant No. N00014-94-1-0302). Accordingly, the U.S. government may have certain rights to the invention.

BACKGROUND OF THE INVENTION

The invention relates to metal oxide nanoscale materials and composite materials based on the metal oxide nanoscale materials.

Metal oxide whiskers are rod-shaped materials having diameters typically greater than or equal to 1 $\mu$m are used extensively in composites due to their high strength and tolerance of high temperatures. Metal oxide whiskers in the same diameter range have been produced by a variety of procedures. Materials with nanometer diameters are useful in particular material applications, such as magnetic information storage and pinning structures in superconductors. Quantum phenomena are expected from materials in the nanometer size regime. Metal carbide nanomaterials, some being rod-shaped, with diameters between 2 and 100 nm have been reported.

SUMMARY OF THE INVENTION

The invention relates to metal oxide nanorods, composite materials containing metal oxide nanorods, and methods of preparing metal oxide nanorods. The metal oxide, nanorods have diameters between 1 and 200 nm and aspect ratios between 5 and 2000.

The metal oxide nanorods, including nanorods of MgO, $Al_2O_3$, and ZnO, can be produced by controlled vapor-solid growth processes using a metal vapor source, such as a mixture of a bulk metal oxide powder and carbon powder, and a low concentration of oxygen gas. Both bulk nanorods and nanorods aligned relative to substrate surfaces can be produced. Because the size regime for these metal oxide nanoparticles is smaller than that of traditional whiskers, we term the materials nanorods. The reduction in size leads to materials with improved properties. For example, it is known that strength increases with decreasing diameter in this class of materials.

In one aspect, the invention relates to a metal oxide nanorod where the metal component contains a metal (e.g., one or more) selected from the group consisting of titanium, zirconium, hafnium, vanadium, niobium, tantalum, chromium, molybdenum, tungsten, manganese, technetium, rhenium, iron, osmium, cobalt, nickel, copper, zinc, scandium, yttrium, lanthanum, a lanthanide series element (e.g., cerium, praseodymium, neodymium, promethium, samarium, europium, gadolinium, terbium, dysprosium, holmium, erbium, thulium, ytterbium, and lutetium), boron, aluminum, gallium, indium, thallium, silicon, germanium, tin, lead, magnesium, calcium, strontium, and barium. The metal oxide nanorod has a narrow dimension (diameter) and a long dimension (length). Since the particles are nanorods, the narrow dimension of the particle is between 1 and 200 nm, more preferably between 5 and 50 nm. The nanorod can be further described by the aspect ratio (the ratio of the length to the diameter), which is preferably between 5 and 2000. Lengths are generally greater than 1 $\mu$m.

In examples, the metal oxide nanorod contains a metal component selected from the group consisting of magnesium, aluminum, zinc, cadmium, iron, and nickel. In other examples, the metal oxide nanorod is aligned relative to the surface of a substrate or a single crystal substrate. In certain examples, the nanorods are perpendicular to the surface, meaning that the nanorods are aligned within 15° of the substrate surface normal.

The metal oxide nanorod can be contained in a matrix material such as organic polymers, glass, ceramics, metals, or mixtures thereof. For example, the metal matrix may be a Ni/Al alloy or $MoSi_2$. In examples, the matrix material is a superconductor such as low temperature superconducting materials (e.g., Nb, NbTi, $Nb_3Sn$, or amorphous MoGe) or a high temperature copper oxide superconductor (e.g., $Bi_2Sr_2CaCu_2O_8$, $YBa_2Cu_3O_7$, $Tl_2Ba_2Ca_2Cu_3O_{10}$, or $Tl_2Ba_2CaCu_2O_8$. In a composite formed on a substrate, the metal oxide nanorods can be aligned nearly perpendicular to the surface of the substrate.

Another aspect of this invention relates to a method of producing metal oxide nanorods. The method involves the following three steps. First, a powdered metal vapor source is placed in a tube furnace having a carrier gas flowing from one end of the tube furnace to the opposite end of the tube furnace. The carrier gas consists of an inert gas (e.g., argon, helium) and oxygen. The preferred oxygen concentration in the carrier gas is between 1 and 10 ppm. Second, a substrate having nanosized nucleation sites is placed downstream of the metal vapor source. Finally, the contents of the furnace are heated so that the temperature of the metal vapor source is between 500° C. and 1600° C. for between approximately 5 minutes and 2 hours. The nanorods grow on the surface of the substrate.

In examples, the metal vapor source includes an elemental metal or a mixture of metal oxide and carbon. The substrate contributes to the size of the nanocluster. The substrate may be metal oxide nanoclusters, an etched single crystal surface, a gold coated substrate, or combinations thereof. The single crystal surface can be a film on a substrate or the surface of a bulk crystal. All of the substrates have the common feature of having nanosized nucleation sites for growing the nanorods. The nanorods may be encapsulated in a matrix material to form a composite.

As used herein, the term "nanorod" means a solid article having a narrow dimension (diameter) and a long dimension (length), where the ratio of the long dimension to the narrow dimension (the aspect ratio) is at least 5. In general, the aspect ratio is between 10 and 2000. By definition, the narrow dimension of the nanorod is a diameter between 1 and 200 nm. Accordingly, the length of the nanorod is between 0.01 and 400 $\mu$m. The nanorods are solid structures composed, at least partially, of a metal oxide. The nanorods are single crystals. The term "narrow dimension," or alternatively "diameter," means the shortest dimension or cross-sectional thickness of a nanorod. Generally, the diameter of the nanorod is essentially constant along the length of the particular nanorod. The term "long dimension," or alternatively "length," means the longest dimension of the nanorod that is generally orthogonal to the diameter of the nanorod.

The phrase "nanosized nucleation site" means a site capable of initiating growth of a nanorod. Examples etch pits in the surface of single crystals, gold coated substrates, nanoclusters, and combinations thereof. The phrase "aligned relative to a substrate" means that a majority (greater than 50%) of the nanorods extend in the same general direction from the surface of the substrate. For example, the (100) surface of a single crystal MgO substrate supports growth of MgO nanorods aligned perpendicular to the substrate surface. "Aligned perpendicular" means that the nanorods are within 15° of making a 90° angle with the substrate surface. The term "downstream" means that the substrate is positioned relative to the metal vapor source so that the carrier gas delivers metal vapor to the substrate. Generally, this means that the substrate is located beyond the metal vapor source in the direction that the carrier gas is flowing through the furnace. "Downstream" is further intended to describe that the substrate is in a lower temperature region of the furnace. There is a temperature gradient between the metal vapor source and the substrate.

The invention may provide one of the following advantages. The nanorods may have unique metallic, semiconducting, insulating, superconducting, optical, or magnetic properties, or a combination thereof. Some embodiments have a lower density of stacking faults, as measured by TEM and normalized to diameter, than prior larger materials. The nanorods are highly anisotropic.

Other features and advantages of the present invention will be apparent from the following detailed description of the invention, and from the claims.

DETAILED DESCRIPTION

The invention relates to metal oxide nanorods, methods of preparing metal oxide nanorods, and composite materials containing metal oxide nanorods in a matrix material.

The nanorods are primarily composed of metal oxides of the general formula $M^1_xM^2_yO_z$, where $M^1$ and $M^2$ are metals selected from the group consisting of titanium, zirconium, hafnium, vanadium, niobium, tantalum, chromium, molybdenum, tungsten, manganese, technetium, rhenium, iron, osmium, cobalt, nickel, copper, zinc, scandium, yttrium, lanthanum, a lanthanide series element, boron, aluminum, gallium, indium, thallium, silicon, germanium, tin, lead, magnesium, calcium, strontium, and barium. The ratio of the metal to oxygen depends upon the oxidation state of the metal in the compound. In general, one of x and y, and z are integers greater than zero. That is to say, the compounds are stoichiometric and have few oxygen vacancies. When $M^1$ is the same as $M^2$ (or, alternatively, y is zero), the metal oxide is a binary metal oxide. Particular examples of binary metal oxides include MgO, $Al_2O_3$, and ZnO.

Alternatively, the nanorods have a large number of oxygen vacancies. In effect, the materials are better described as metal doped metal oxides of the formula $M^2{:}M^1_xO_z$. The metal may be the same or different. In the case where $M^1$ and $M^2$ are the same, the material can be characterized as a metal oxide with an abundance of oxygen vacancies. The materials are metal doped metal oxides. Examples of compounds of this type include Zn:ZnO and In:ZnO. Compounds of this nature are formed, for example, when carrier gases are less oxidizing than in cases where stoichiometric compositions are obtained.

The invention not only encompasses the metal oxide nanorods, but also other composite materials containing the nanorods. The dimensions of the nanorods permit the building of nanostructures and superior composites. For example, the tensile strength ($kg/mm^2$) of the nanorods is greater than that of the corresponding whisker. For example, bulk and film composites consisting of a high-temperature copper oxide superconductor matrix containing MgO nanorods can be prepared. The nanorods are analogous to columnar defects produced previously by ion irradiation, and are found to enhance significantly the critical current density and irreversibility temperature in these materials.

An alternative approach involves making columnar defect structures in materials by adding a pre-formed columnar structure to the superconducting matrix. There are several key criteria for making useful columnar defect structures. The rod-like structure must have a diameter of approximately 10 nm and a length greater than 1 $\mu$m. Additionally, the rod-like structure must not be chemically reactive with the superconductor matrix at processing temperatures.

Synthesis of metal oxide nanorods

The general synthetic approach used to prepare metal oxide nanorods involves three fundamental steps. First, a metal vapor must be generated from a metal source which is transported by a carrier gas to the substrate. Second, the metal vapor nucleates on the surface of the substrate. The substrate can be a pre-formed metal oxide nanocluster or single crystal defect site. This initiates growth of the metal oxide nanorod. Finally, vapor phase growth of the nanorod takes place. The critical steps essential for the formation of nanorods are the nucleation and growth steps which define the initial size of the metal oxide nanorod and its final diameter.

The metal source must be one that is a volatile source of metal atoms under the reaction conditions. One way to generate a metal vapor is by heating a source containing the elemental metal. Alternatively, carbothermal reduction of bulk metal oxide powder can be used to generate volatile metal vapor. It is important that the carrier gas be composed of an inert gas for transporting the metal vapor to the substrate, and a small component of oxygen gas to make the deposition of metal oxide possible. Commercially available reagents do not generally require pre-treatment before use as long as they are of sufficient purity (>99%). Commercial sources of starting materials and substrates include Aldrich Chemicals, Milwaukee, Wis., Johnson-Mathey, Ward Hill, Mass., and Marketech International, Pittsburgh, Pa.

The temperature profile for growing metal oxide nanorods can be determined from the phase diagram for the components of the nanorod or by experiment. In general, the substrate is placed downstream of the metal vapor source. As a result, there is a temperature gradient between the metal vapor source and the substrate.

The properties of the nanorods can be determined, for example, by transmission electron microscopy (TEM) to measure crystallographic orientations and stacking fault density, energy-dispersive x-ray fluorescence to measure the presence of elements having a mass greater than or equal to sodium, x-ray diffraction (XRD) to measure crystal structures, and convergent beam electron diffraction to measure lattice symmetry or the lattice constant a.

The metal oxide nanorods are ideally single crystals and are primarily characterized by crystal structure. The single crystal materials consist of a single crystalline domain.

Without intending to be bound to any theories, it is believed the mechanism of nanorod formation involves vapor phase growth, where the nanoparticles or etched single crystal surfaces provide nucleation sites for growth of the nanorods. The average nanorod diameter is determined in part by the size of the nanoparticles during the bulk synthesis of the nanorods. In order to obtain high densities of aligned nanorods on the surface of a single crystal substrate, it is necessary to freshly etch the surface of the single crystal substrate. This process provides a surface with numerous nanosized sites for nucleation and growth of nanorods, provided there is a good lattice match between the surface of the substrate and the growth plane of the nanorods.

Uses of metal oxide nanorods

The metal oxide nanorods can be used in the preparation of nanostructures having superior mechanical, electrical, optical and/or magnetic properties, such as high density magnetic recording media. The small diameters and high aspect ratios of the nanorods make them useful in metal, glass, organic polymer, and ceramic matrix composites. In particular, the metal oxide nanorods of the invention are useful as defects embedded within a superconductor.

For example, theoretical and experimental studies have demonstrated that columnar defects enhance critical current densities and shift the irreversibility line to higher temperatures in copper oxide superconductors due to strong pinning of magnetic flux-lines in the superconductors. The columnar defects should have diameters between 5 and 10 nm to maximize pinning while maintaining other desirable superconducting properties. Defects of these dimensions have been obtained by irradiating samples with high energy heavy ions or high energy protons. Pinning structures in superconductors are described in, for example, P. LeDoussal and D. R. Nelson, *Physica C* 232:69–74 (1994).

Nanorod-superconductor composites may be useful materials for superconducting wires used in power transmission and magnetic solenoids or thin film devices requiring large current densities and power throughputs such as send/receive filters in cellular communication base stations.

Metal oxide nanorod-superconductor composites

Metal oxide nanorod-superconductor composites can be made in bulk and film form. The composites have a columnar defect structure and enhanced critical current behavior. Composites can be prepared using MgO nanorods since these materials appear to react the least with high temperature superconductors such as $Bi_2Sr_2CaCu_2O_8$ (BSCCO-2212) superconductors, although it can be applied to other high temperature superconductors and BSCCO phases by simple modification of experimental conditions.

Bulk composite materials were made by combining nanorods and pre-reacted BSCCO powder. The resulting mixture is melt-textured on silver foil using procedures similar to making Ag/BSCCO tapes, as described in, for example, K. Nomara, et al., *Applied Physics Letters,* 62:2131–2133 (1993). TEM structural analysis of these bulk composites demonstrate that MgO nanorods are incorporated into crystal grains of BSCCO, and that nanorods are oriented principally perpendicular and parallel to the Cu—O planes of the superconductor.

Film composite materials were prepared by depositing amorphous BSCCO material at low temperature onto a MgO substrate containing aligned MgO nanorods with a rod density of $2–5 \times 10^9$ $cm^{-2}$. The composite was subsequently melt-textured thus causing crystallization and alignment of the BSCCO matrix. X-ray diffraction shows that the melt-textured BSCCO is aligned with the c-axis perpendicular to the substrate surface. In addition, TEM analysis demonstrates clearly that MgO nanorods pass through the BSCCO Cu—O planes, and have a size and density comparable to that of the starting substrate.

As expected, the critical current densities of the nanorod-BSCCO composites are enhanced dramatically compared to reference samples. The enhancements are comparable to those obtained previously using heavy-ion irradiation techniques (See, e.g., P. Kummeth, et al., *J. Alloys and Compounds* 195:403–406).

Without further elaboration, it is believed that one skilled in the art can, based on the description herein, utilize the present invention to its fullest extent. All publications cited herein are hereby incorporated by reference. The following specific examples are, therefore, to be construed as merely illustrative, and not limitive of the remainder of the disclosure.

EXAMPLE 1

Bulk synthesis of MgO nanorods

MgO powder and graphite powder were mixed in a weight ratio between 1:3 and 3:1. The resulting powder mixture was loaded into a graphite boat. The graphite boat was placed into a quartz tube flushing with Ar gas with a flow rate of between 100 and 2000 sccm. The gas contained between 1 and 10 ppm oxygen. The substrate was placed in the tube downstream of the graphite boat where the temperature gradient between the graphite boat and the substrate was less than 100° C. In the synthesis of bulk MgO nanorods, the substrate was composed of MgO nanoclusters with average diameters between 5 and 50 nm. The nanorods were obtained by heating the quartz tube to approximately 1200° C. for 0.5 to 2 hours.

The nanorods of MgO grew on the surface of the nanoclusters. The nanorods have diameters in the range from 5–100 nm depending on the reaction time, initial substrate nanocluster size and local supersaturation. The lengths of the nanorods ranges from 1–10 $\mu$m. The reaction times, initial nanocluster diameters and nanorod dimensions are listed in Table I.

TABLE I

| Nanocluster Diameter (nm) | Reaction Time (min) | Nanorod Diameter (nm) | Length ($\mu$m) |
|---|---|---|---|
| 5–50 | 30 | 10–50 | 1–10 |
| 5–50 | 60 | 50–100 | 1–10 |
| 30–150 | 60 | 50–150 | 1–10 |

EXAMPLE 2

MgO nanorods aligned on a substrate surface

The nanorods were prepared by the methods described in Example 1, except in order to obtain nanorods aligned on a substrate surface, a single crystal that has been freshly etched was used as the substrate. Specifically, the substrate was the (100) face of a MgO single crystal which was etched with 0.1 to 0.5M aqueous $NiCl_2$ solution for 0.25 to 2 hours. The substrate was placed in the furnace immediately after etching. The etching time effects the density of the nanorods on the surface. Typically, etching times of 0.5 hours and etching solution concentrations of 0.5M are used.

The nanorods grown on the single crystal surface are relatively uniform in diameter and length. The diameter ranges from 10 to 30 nm the length varies from and 1 to 2 $\mu$m. The nanorods are oriented on the crystal surface. Most (e.g., greater than 50%, more preferably greater than 80%) of the nanorods are perpendicular to the (100) surface while the others are at a 450 angle to the substrate surface. The packing density of the nanorods on the surface is between $1 \times 10^7$ and $5 \times 10^9$ $cm^{-2}$ depending on the concentration of the etching solution and the etching time. Particular etching times, etching solution concentrations and nanorod densities are listed in Table II.

TABLE II

| Etching Time (min) | Density of nanorods ($cm^{-2}$) |
|---|---|
| 0 | $5 \times 10^8$ |
| 15 | $1 \times 10^9$ |
| 30 | $5 \times 10^9$ |

Note: The etching solution concentration was 0.5M.

EXAMPLE 3
Bulk synthesis of $Al_2O_3$ nanorods $Al_2O_3$ powder and graphite powder were mixed in a weight ratio of between 1:3 and 3:1. The mixture was loaded into a graphite boat. The graphite boat was put into a alumina tube flushing with Ar gas at a flow rate between 100 and 2000 sccm. The gas contained between 1 and 10 ppm oxygen. $Al_2O_3$ nanoclusters with average diameters between 5 and 10 nm were put downstream of the graphite boat where the temperature gradient between the graphite boat and the substrate was 100° C. The tube was heated to 1400° C. for 0.5 to 2 hr to generate the nanorods.

The nanorods of $Al_2O_3$ collected on the surface of nanoclusters. The nanorods have diameters ranging from 5 to 100 nm and lengths ranging from 1 to 10 μm.

EXAMPLE 4
ZnO nanorods aligned on a substrate surface

ZnO powder and graphite powder was mixed in a weight ratio 1:3 to 3:1. The mixture was loaded into a graphite boat which was placed into a quartz tube being flushed with Ar gas with a flow rate between 100 and 2000 sccm. The gas contained between 1 and 10 ppm oxygen. A (100) $SrTiO_3$ single crystal substrate coated with a film of gold with a thickness between 1 and 100 nm was placed in the tube downstream of the graphite boat where the temperature gradient between the graphite boat and the substrate was approximately 300° C. The quartz tube was heated to between 900° C. and 100° C. for between 0.25 to 1 hour to grow the nanorods.

Alternatively, zinc metal can be used as the metal vapor source, in which case the tube furnace was heated to between 500° C. and 700° C.

The nanorods grown on the single crystal surface were uniform in diameter and length, ranging from 10 to 50 nm and 1 to 2 μm, respectively. Nearly all of the nanorods were oriented relative to the crystal surface, but were not normal to the surface.

EXAMPLE 5
Bulk nanorod-superconductor composites

MgO nanorods with diameters between 10 and 100 nm and lengths between 1 and 10 μm were mixed and ground with pre-reacted BSCCO(2212) powder. The mixture contained between 0 and 15 percent nanorods by weight. The fine powder mixture was pressed into a pellet using a pellet compressor (e.g., 10 tons over a 20 mm diameter die). The resulting pellet was placed onto the surface of Ag foil and was heated to between 860 and 880° C. The material was maintained in this partially melted state for between 10 and 30 minutes. The temperature was decreased at a rate of between 1 and 5° C. per hour to between 760 and 800° C. The material was held at this temperature for between 10 and 24 hours at which time the sample was cooled down to room temperature to yield the final composite. The composite had much higher critical current densities than a reference sample processed in a similar manner that did not contain the MgO nanorods. At 5 K, 0 Tesla, the critical current density of the composite in comparison to a reference sample lacking nanorods increased from $2\times10^4$ to $2\times10^5$ A $cm^{-2}$, and at 30 K, 0 Tesla, it increased from $4\times10^3$ to $5\times10^4$ A $cm^{-2}$. Over the temperature range of 5 to 60 K, there was a one magnitude increase in critical current density.

EXAMPLE 6
Film nanorod-superconductor composites

The MgO nanorods were first grown on the (100) surface of a MgO single crystal substrate as described above in Example 2. Amorphous BSCCO(2212) was deposited on the substrate using pulsed laser deposition at room temperature. Pulsed laser deposition is described in, for example, S. Zhu, et al., *Applied Physics Letters*, 63:409–411 (1993). The amorphous composite was subsequently melt-textured using the heating program described for the bulk composite in Example 5 to afford the final film composite material. The critical current density of the film composite is much greater than that of a reference sample without nanorods. At 5 K, 0.8 Tesla, the critical current density of the composite in comparison to a reference sample lacking nanorods increased from $2\times10^4$ to $1.5\times10^5$ A $cm^{-2}$, at 40K, 0.5 Tesla, it increased from $1\times10^3$ to $2\times10^4$ A $cm^{-2}$, and at 60 K, 0.15 Tesla, it increased from $8\times10^2$ to $1\times10^4$ A $cm^{-2}$.

Other Embodiments

From the above description, the essential characteristics of the present invention can be ascertained. Without departing from the spirit and scope thereof, various changes and modifications of the invention can be made to adapt it to various usages and conditions. Thus, other embodiments are also within the claims.

What is claimed is:

1. A composite comprising a substrate and a metal oxide nanorod consisting essentially of a metal oxide comprising a metal selected from the group consisting of titanium, zirconium, hafnium, vanadium, niobium, tantalum, chromium, molybdenum, tungsten, manganese, technetium, rhenium, iron, osmium, cobalt, nickel, copper, zinc, cadmium, scandium, yttrium, lanthanum, a lanthanide series element, boron, gallium, indium, thallium, germanium, tin, lead, magnesium, calcium, strontium, and barium, or said metal oxide is $Al_2O_3$; wherein said metal oxide nanorod has a narrow dimension between 1 and 100 nanometers, and an aspect ratio between 5 and 2000, wherein the metal oxide nanorod is a single crystal, and said metal oxide nanorod is on the substrate and is aligned perpendicular to a surface of the substrate.

2. The composite of claim 1 wherein said metal is selected from the group consisting of magnesium, zinc, cadmium, iron, cerium, zirconium, yttrium, barium, strontium, titatium, lanthanum, and nickel.

3. The composite of claim 2 wherein said narrow dimension is between 5 and 50 nanometers.

4. The composite of nanorod of claim 1 wherein said narrow dimension is between 5 and 50 nanometers.

5. The composite of claim 1, wherein the metal oxide nanorod consists essentially of zinc oxide or metal-doped zinc oxide.

6. A composite comprising a substrate and a metal oxide nanorod comprising magnesium oxide wherein said metal oxide nanorod is a single crystal and has a narrow dimension between 1 and 100 nanometers, and an aspect ratio between 5 and 2000, and the metal oxide nanorod is on the substrate and is aligned perpendicular to a surface of the substrate.

7. A composite comprising a substrate and a metal oxide nanorod consisting essentially of a metal oxide made of the elements $M^1$, $M^2$, and oxygen, wherein $M^1$ is a metal selected from the group consisting of titanium, zirconium, hafnium, vanadium, niobium, tantalum, chromium, molybdenum, tungsten, manganese, technetium, rhenium, iron, osmium, cobalt, nickel, copper, zinc, cadmium, scandium, yttrium, lanthanum, a lanthanide series element, boron, aluminum, gallium, indium, thallium, silicon, germanium, tin, lead, magnesium, calcium, strontium, and barium, and $M^2$ is a metal selected from the group consisting of titanium, zirconium, hafnium, vanadium, niobium, tantalum, chromium, molybdenum, tungsten, manganese, technetium, rhenium, osmium, cobalt, nickel, zinc, cadmium, scandium, yttrium, lanthanum, a lanthanide series element, boron, gallium, indium, thallium, germanium, tin, lead, magnesium, calcium, strontium, and barium; wherein said metal oxide nanorod is a single crystal and has a narrow dimension between 1 and 100 nanometers and an aspect ratio between 5 and 2000, and said metal oxide nanorod is on the substrate and is aligned perpendicular to a surface of the substrate.

8. The composite of claim 7 wherein $M^1$ is selected from the group consisting of magnesium, aluminum, zinc, cadmium, iron, cerium, zirconium, yttrium, barium, strontium, titanium, lanthanum, and nickel, and $M^2$ is selected from the group consisting of magnesium, zinc, cadmium, cerium, zirconium, yttrium, barium, strontium, titanium, lanthanum, and nickel.

9. The composite of claim 7 wherein said narrow dimension is between 5 and 50 nanometers.

10. The composite of claim 7 wherein the metal oxide is MgO, ZnO, Zn:ZnO, or In:ZnO.

11. A nanorod composite comprising a metal oxide nanorod contained in a surrounding matrix material, wherein said metal oxide nanorod consists essentially of a single crystal of a metal oxide, said metal oxide comprising a metal selected from the group consisting of titanium, zirconium, hafnium, vanadium, niobium, tantalum, chromium, molybdenum, tungsten, manganese, technetium, rhenium, iron, osmium, cobalt, nickel, copper, zinc, cadmium, scandium, yttrium, lanthanum, a lanthanide series element, boron, aluminum, gallium, indium, thallium, germanium, tin, lead, magnesium, calcium, strontium, and barium; said metal oxide nanorod having a narrow dimension between 1 and 200 nanometers and an aspect ratio between 5 and 2000; and said matrix material includes a superconductor.

12. The nanorod composite of claim 11 wherein said matrix material is a copper oxide superconductor.

13. The nanorod composite of claim 11 wherein said composite includes a substrate and a plurality of said metal oxide nanorods, and said metal oxide nanorods are aligned perpendicular to a surface of the substrate.

14. The nanorod composite of claim 11 wherein said metal oxide nanorod is a magnesium oxide nanorod.

15. The nanorod composite of claim 11 wherein the metal oxide is MgO, $Al_2O_3$, ZnO, Zn:ZnO, or In:ZnO.

16. The nanorod composite of claim 11 wherein the metal oxide is made of the elements $M^1$, $M^2$, and oxygen, wherein $M^1$ is a metal selected from the group consisting of titanium, zirconium, hafnium, vanadium, niobium, tantalum, chromium, molybdenum, tungsten, manganese, technetium, rhenium, iron, osmium, cobalt, nickel, copper, zinc, cadmium, scandium, yttrium, lanthanum, a lanthanide series element, boron, gallium, indium, thallium, germanium, tin, lead, magnesium, calcium, strontium, and barium; and $M^2$ is a metal selected from the group consisting of titanium, zirconium, hafnium, vanadium, niobium, tantalum, chromium, molybdenum, tungsten, manganese, technetium, rhenium, osmium, cobalt, nickel, zinc, cadmium, scandium, yttrium, lanthanum, a lanthanide series element, boron, gallium, indium, thallium, germanium, tin, lead, magnesium, calcium, strontium, and barium.

17. A nanorod composite comprising a metal oxide nanorod contained in a surrounding superconductor matrix material, wherein said metal oxide nanorod consists essentially of a single crystal of a metal oxide and said metal oxide comprises a metal selected from the group consisting of titanium, zirconium, hafnium, vanadium, niobium, tantalum, chromium, molybdenum, tungsten, manganese, technetium, rhenium, iron, osmium, cobalt, nickel, copper, zinc, cadmium, scandium, yttrium, lanthanum, a lanthanide series element, boron, aluminum, gallium, indium, thallium, silicon, germanium, tin, lead, magnesium, calcium, strontium, and barium, said metal oxide nanorod having a narrow dimension between 1 and 200 nanometers and an aspect ratio between 5 and 2000.

18. The nanorod composite of claim 17 wherein said metal is selected from the group consisting of magnesium, aluminum, zinc, cadmium, cerium, zirconium, yttrium, barium, strontium, titanium, and lanthanum.

19. The nanorod composite of claim 17 wherein said nanorod composite is a film on a substrate and said metal oxide nanorod is aligned relative to a surface of the substrate.

20. The nanorod composite of claim 17 wherein said superconductor is a copper oxide superconductor.

21. The nanorod composite of claim 20 wherein said copper oxide superconductor is $Bi_2Sr_2CaCu_2O_8$, $YBa_2Cu_3O_7$, $Tl_2Ba_2Ca_2Cu_3O_{10}$, or $Tl_2Ba_2CaCu_2O_8$.

22. The nanorod composite of claim 17 wherein said composite includes a plurality of said metal oxide nanorods.

23. The nanorod composite of claim 22 wherein the nanorod composite is a film on a substrate and each of said plurality of metal oxide nanorods is aligned perpendicular to a surface of the substrate.

24. The nanorod composite of claim 17 wherein said composite is a film composite.

25. The nanorod composite of claim 17 wherein the composite is a bulk composite.

26. The nanorod composite of claim 17 wherein said metal oxide nanorod is a magnesium oxide nanorod.

* * * * *